(12) United States Patent
Hardikar et al.

(10) Patent No.: US 7,195,548 B1
(45) Date of Patent: Mar. 27, 2007

(54) METHOD AND APPARATUS FOR POST-CMP CLEANING OF A SEMICONDUCTOR WORK PIECE

(75) Inventors: Vishwas V. Hardikar, Phoenix, AZ (US); James A. Schlueter, Phoenix, AZ (US); Guangshun Chen, Phoenix, AZ (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/363,640

(22) Filed: Feb. 28, 2006

Related U.S. Application Data

(62) Division of application No. 10/880,945, filed on Jun. 29, 2004.

(51) Int. Cl.
*H01L 21/00* (2006.01)
(52) U.S. Cl. ..................................... 451/285
(58) Field of Classification Search ............... 438/692, 438/745; 156/345.12; 216/38, 88; 451/41, 451/54, 285, 286, 287, 288
See application file for complete search history.

(56) References Cited

U.S. PATENT DOCUMENTS

| | | | |
|---|---|---|---|
| 5,078,801 A | 1/1992 | Malik | |
| 6,006,765 A | 12/1999 | Skrovan et al. | |
| 6,368,183 B1 | 4/2002 | Trojan et al. | |
| 6,586,336 B2 * | 7/2003 | Jeong | 438/692 |
| 6,727,187 B2 | 4/2004 | Takeshima et al. | |
| 6,852,007 B1 * | 2/2005 | Gonzalez-Martin et al. | 451/28 |
| 2001/0039116 A1 | 11/2001 | Takeshima et al. | |
| 2002/0107155 A1 | 8/2002 | Miller et al. | |

* cited by examiner

*Primary Examiner*—Jacob K. Ackun, Jr.
(74) *Attorney, Agent, or Firm*—Ingrassia Fisher & Lorenz, P.C.

(57) ABSTRACT

A method and apparatus are provided for post-CMP cleaning of a semiconductor work piece. The method comprises the steps of subjecting the work piece to a first cleaning composition having one of an acidic pH and a basic pH and subjecting the work piece to a second cleaning composition having an acidic pH, if the first cleaning composition has a basic pH and subjecting the work piece to a second cleaning composition having a basic pH, if the first cleaning composition has an acidic pH.

20 Claims, 6 Drawing Sheets

METHOD AND APPARATUS FOR POST-CMP CLEANING OF A SEMICONDUCTOR WORK PIECE

CROSS-REFERENCES TO RELATED APPLICATIONS

This application is a divisional of application Ser. No. 10/880,945 filed Jun. 29, 2004.

This invention relates generally to chemical mechanical polishing and/or chemical mechanical planarization ("CMP"), and more particularly, to methods and apparatus for use in post-CMP cleaning of a semiconductor work piece.

BACKGROUND OF THE INVENTION

Technical Field

Chemical mechanical polishing (CMP) is one of several processes used in the manufacture of semiconductor chips. CMP is generally used to polish the surface of an unprocessed or partially processed work piece to provide a substantially smooth surface suitable for the application of subsequent fabrication processes, such as photoresist coating and pattern definition. The CMP process can be used in various instances during the manufacture of an integrated circuit, for example, at the beginning of the manufacturing process, or after a metallization process. During CMP, a work piece surface is generally polished by contacting the work piece to a polishing surface and moving at least one relative to the other. Optionally, a polishing compound, such as an acidic or basic slurry, can be imparted to the work piece during polishing.

After a polishing process, undesirable contaminants from the polishing slurry and particles of the removed material may be present on the work piece. These contaminants and particles cause corrosion of metals and/or lead to undesirable local conductive and dielectric properties of the processed layers. Defective work pieces may result, which ultimately may yield inoperable devices. Thus, after the polishing process, the work piece may need to undergo cleaning and drying before further processing can take place on the work piece.

Typically, a work piece is buffed with a soft pad, such as a Politex pad from Rohm & Haas Equipment Manufacturers, Inc., using deionized water or abrasive slurry to smooth out surface non-uniformities. Then, the work piece is cleaned with either an acidic or a basic cleaning composition. Conventional cleaning methods may employ the use of polishing or scrubbing brushes to deliver a cleaning composition the surface of the work piece. Other conventional cleaning techniques include spraying a cleaning composition on to the work piece. Yet other cleaning techniques include dipping the work piece into a bath containing a cleaning composition and using a transducer to create sonic waves that travel through the cleaning composition to the work piece surface to impart energy useful in cleaning and dislodging the unwanted particles from the work piece.

Although the above-mentioned methods may be adequate for cleaning work pieces used in the manufacture of larger electronic devices, they have not been as useful for cleaning microelectronic devices of nanometer levels. As microelectronic devices become increasingly smaller, work piece defect count becomes more important to the manufacture of operable devices. It has been found that prior methods of cleaning may not remove a sufficient number of particles from the work piece to yield a work piece having a defect count that is low enough to be useful for the manufacture of operable microelectronic devices.

Accordingly, it is desirable to provide an improved method and apparatus for cleaning a semiconductor work piece. Moreover, a method and apparatus is desirable that is capable of decreasing the number of defects on the work piece. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF EXEMPLARY EMBODIMENTS

Figure 1:
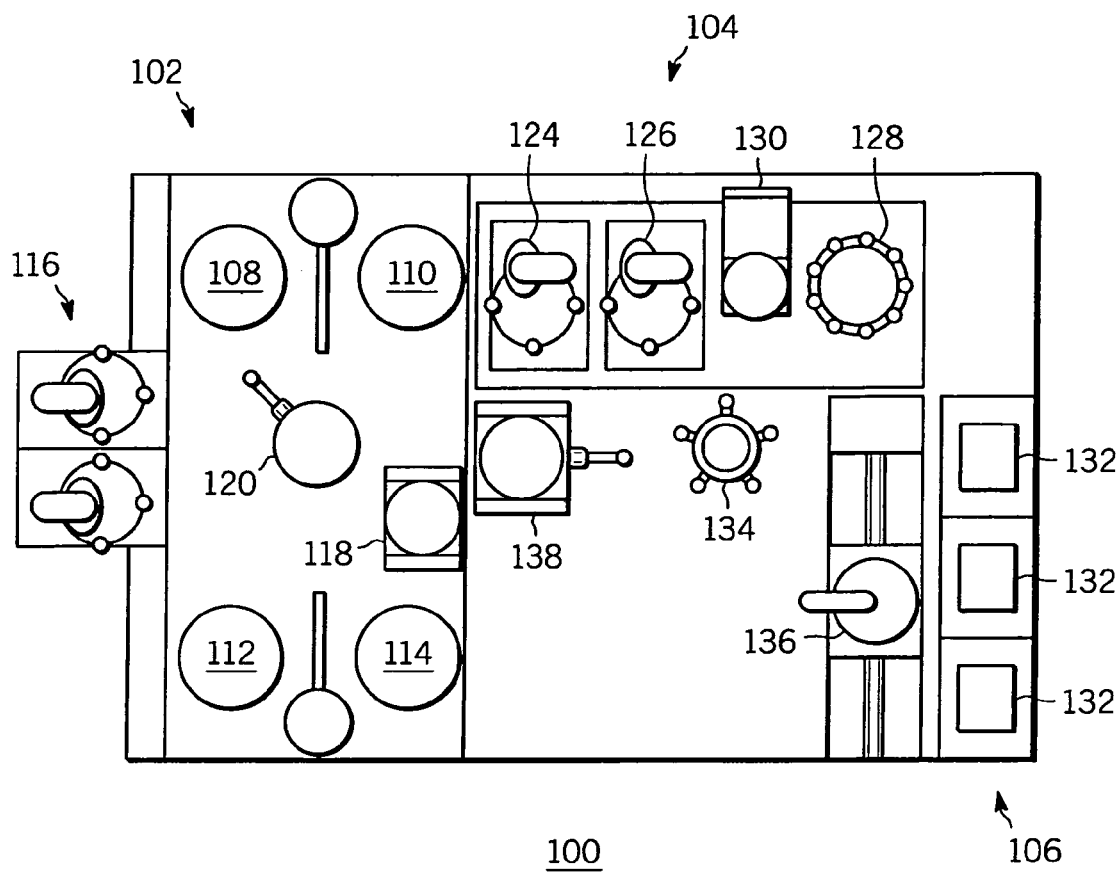
FIG. 1 is a top cutaway view of a CMP apparatus within which an exemplary embodiment of the method of the present invention may be used.

The following detailed description of the invention is merely exemplary in nature and is not intended to limit the invention or the application and uses of the invention. Furthermore, there is no intention to be bound by any theory presented in the preceding background of the invention or the following detailed description of the invention.

The drawing figures are intended to illustrate the general manner of employing the inventive method in an apparatus and are not necessarily to scale. In the description and in the claims, the terms such as up, down, downward, inward, upper, lower, top, bottom, and the like may be used for descriptive purposes. However, it should be understood that the embodiments of the invention described herein are capable of operation in other orientations than as shown, and the terms so used are only for the purpose of describing relative positions and are interchangeable under appropriate circumstances. The term "chemical mechanical planarization" is also often referred to in the industry as "chemical mechanical polishing," and it is intended to encompass herein both terms by the use of "chemical mechanical planarization" and to represent each by the acronym "CMP." For the purposes of illustration only, the invention will be described as it applies to a CMP apparatus and to a CMP process and specifically as it applies to the CMP processing of a semiconductor work piece. It is not intended, however, that the invention be limited to these illustrative embodiments; instead, the invention is applicable to a variety of processing apparatuses and to the processing and handling of many types of work pieces. As used herein, "work piece", shall mean semiconductor substrates, which may include layers of insulating, semiconducting, and conducting layers or features formed thereon and used to manufacture microelectronic devices.

FIG. 1 schematically illustrates an exemplary embodiment of a CMP apparatus 100 according to the present invention. The CMP apparatus 100 generally includes a multi-station polishing system 102, a clean system 104, and a work piece load/unload station 106. Additionally, the CMP apparatus 100 preferably includes at least one controller (not shown) that is coupled to each system 102, 104, and the load/unload station 106 and is configured to at least operate the systems 102, 104 and load/unload station 106 according to at least one embodiment of the method of the present invention.

The polishing system 102 is configured to polish a work piece that is transferred thereto and may include one or more, preferably four polishing stations 108, 110, 112, and 114, buff station 116, a stage 118, and a robot 120 configured to transport the work piece between the polishing stations 108–114 and the stage 118. Each polishing station 108–114 is configured to operate independently from one another and may be configured to perform specific functions of the CMP process, such as the delivery of CMP slurry to a work piece. A slurry container (not shown) may be externally or internally associated with the polishing system 102 to supply CMP slurry to the polishing stations 108–114 through at least one supply channel (not shown). CMP slurry may be supplied to a work piece via any one of numerous conventionally used methods. For example, slurry can be supplied to a polishing platen for a through-the-pad polishing system, or to a work piece holder for systems in which the slurry is dispensed on to the work piece surface.

The clean system 104 includes two cleaning stations 124, 126, a spin rinse dryer 128, and a robot 130 configured to transport the work piece between the cleaning stations 124, 126 and the spin rinse dryer 128. Although two cleaning stations 124, 126 are depicted in this embodiment, the clean system 104 may comprise one cleaning station or more than two cleaning stations.

Each cleaning station 124, 126 is configured to deliver a cleaning composition to a work piece. The cleaning stations 124, 126 may be in fluid communication with at least one cleaning composition container, suitably constructed to contain either an acidic or basic cleaning composition, discussed in more detail below. In accordance with one exemplary embodiment of the present invention, one or both of the cleaning stations 124, 126 may additionally be configured to deliver a neutralizing agent to the work piece. The neutralizing agent can be delivered by any one of numerous methods and by any one of numerous configurations. For example, the neutralizing agent may be sprayed or misted on to the work piece, or the work piece may be rinsed in the neutralizing agent. In another example, a separate component, such as a separate tank or bath that may be configured to contain the neutralizing agent, may be coupled to the apparatus 100, and the work piece may be dipped into the tank or bath.

The load/unload station 106 includes at least one cassette 132, an intermediate staging area 134, a dry robot 136, and a wet robot 138. The cassette 132 is configured to include one or more work pieces. When the cassette 132 is suitably coupled to the apparatus, the dry robot 136 transports a work piece from the cassette 132 to the intermediate staging area 134. From the staging area 134, the work piece then may be transported by the wet robot 138 to the polishing system 102 via stage 118. After polishing, the wet transport robot 138 then may transfer the work piece to the clean system 104 for cleaning and drying prior to transport back to the load/unload station 106.

Figure 2:
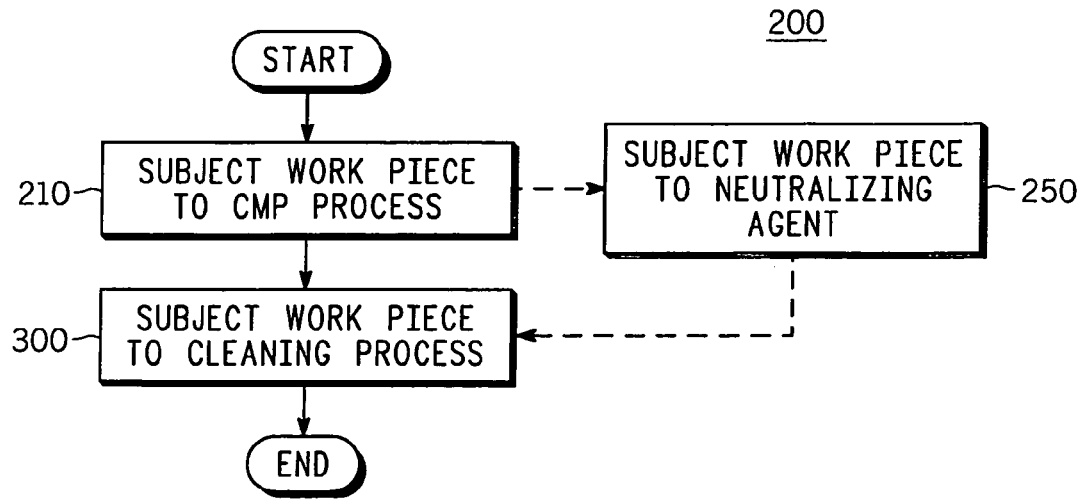
FIG. 2 is a flowchart depicting a method for cleaning a semiconductor work piece according to one exemplary embodiment of the present invention.
Figure 3:
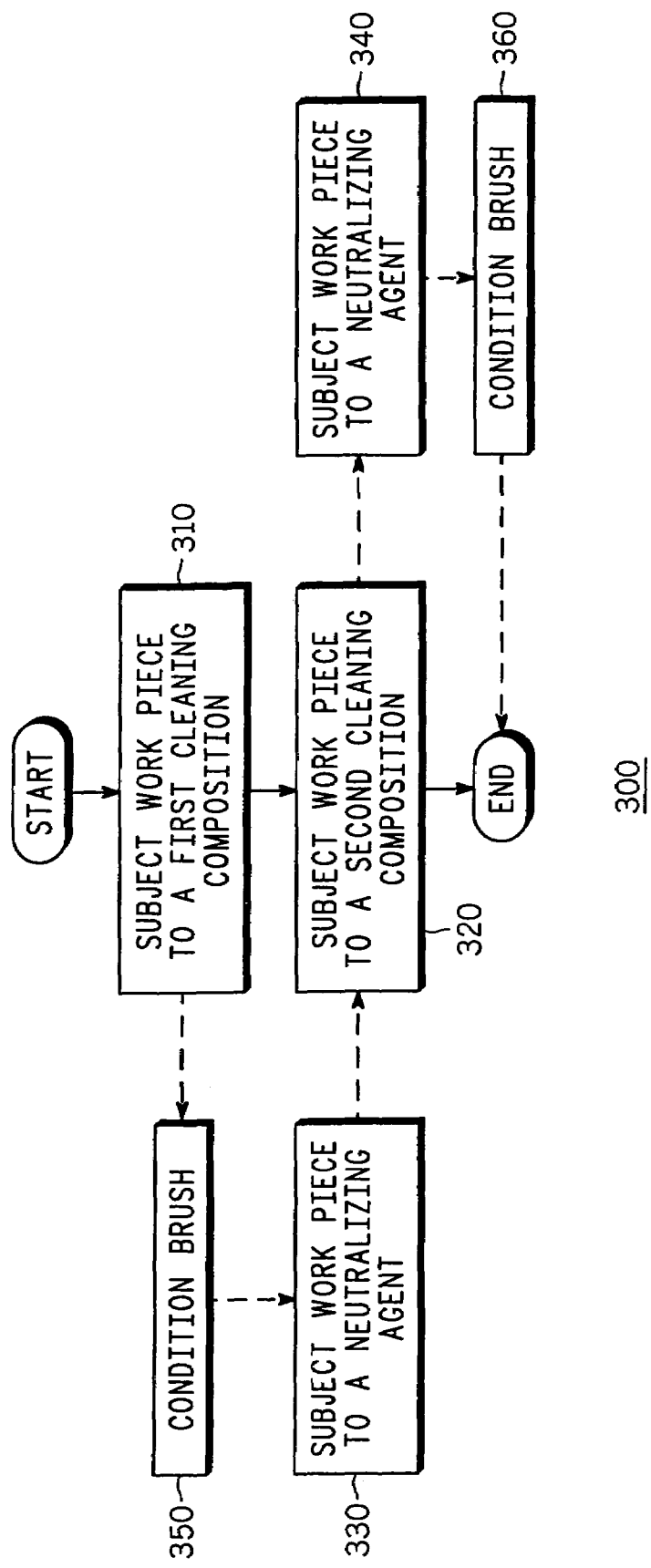
FIG. 3 is a flowchart depicting a method for cleaning a semiconductor work piece according to another exemplary embodiment of the present invention.

Turning to FIGS. 2 and 3, an exemplary embodiment of a method (200) for cleaning a semiconductor work piece according to the present invention will now be provided. The steps of the process depicted in the flowcharts are referenced herein by the use of parentheticals.

Referring to FIG. 2, a work piece first is exposed to a conventional CMP process (210). In accordance with an exemplary embodiment of the method of the present invention, the work piece is polished with a polishing slurry that may be either an acidic, basic, or neutral composition. It will be understood that any one of numerous other methods for polishing a work piece may also be employed. After polishing, inorganic and/or organic contaminants may undesirably remain on the work piece surface. Accordingly, after the CMP process, the work piece is subjected to a cleaning process (300).

FIG. 3 illustrates in further detail cleaning process (300) in accordance with one exemplary embodiment of the invention. After polishing the work piece surface, the polished work piece surface is exposed to a first cleaning composition to remove at least a portion of the contaminants that appear on the surface of the work piece (310). Then, the work piece is subjected to a second cleaning composition (320) to remove at least a portion of the contaminants that were not cleaned from the work piece surface after exposure to the first cleaning composition. These steps will now be described in further detail.

In accordance with one exemplary embodiment of the present invention, the first cleaning step (310) may further comprise the step of determining whether to first impart an acidic or basic cleaning composition to the polished work piece. This determination is largely dependent upon whether the work piece was exposed to a polishing slurry during the CMP step (210) and, if so, upon the pH of the polishing slurry that was utilized.

As previously mentioned, polishing slurry may be acidic, basic, or neutral. In this regard, if an acidic polishing slurry was utilized during the CMP step (210), the first cleaning composition may be an acidic cleaning composition. As is known in the art, acidic cleaning compositions are useful for removing inorganic contaminants. When exposed to an acidic composition, the metal ion contaminants form soluble salts that can be removed from the workpiece surface. If the metal ion contaminants are exposed to a basic cleaning chemistry, insoluble hydroxides may form, which may be difficult to remove. Thus, when slurry having an acidic pH is used in the CMP processing of a work piece, the work piece may first be cleaned with an acidic cleaning composition to remove inorganic contaminants. Suitable acidic cleaning compositions generally comprise a pH adjuster, such as an organic acid, a metal ion complexing agent, a buffering agent, a corrosion inhibitor, and a surfactant. Commercially available acidic cleaning compositions include, but are not limited to, Kanto CMP-MO2 (manufactured by Kanto Corporation of Portland, Oreg.), Ashland CP70 or CP72 or Arch PC300 or 402 (each manufactured by Arch Chemicals of Norwalk, Conn.), Wako Clean 100 or 200LK (manufactured by Wako Chemicals USA of Richmond, Va.), or any one of numerous other conventional acidic cleaning compositions.

In accordance with another exemplary embodiment of the present invention, a basic polishing slurry may be employed during the CMP step (210) and, accordingly, the first cleaning composition may be a basic cleaning composition. When the particles are exposed to the basic cleaning composition, the particles take on a negative charge due to the adsorption of hydroxyl ions present in the basic cleaning composition. Because the surface and the particles have like charges, they repel from one another. As a result, the particles may be removed from the workpiece surface. Basic cleaning compositions generally may comprise a pH adjuster, such as a tetraalkylammonium hydroxide, a metal ion complexing agent, a buffering agent, a corrosion inhibitor, and a surfactant. Appropriate basic cleaning compositions include, but are not limited to, ESC series of chemicals available from ATMI, Inc. of Danbury, Conn.

In an alternative embodiment of the invention, the decision to utilize either an acidic or basic first cleaning composition during the first cleaning step (310) may depend on any suitable factor or factors other than the pH of the slurry. For example, in accordance with one exemplary embodiment of the invention and with reference again to FIG. 2, the work piece may be exposed to a neutralizing agent (250) between the CMP step (210) and the first cleaning step (310). The neutralizing agent neutralizes the pH of the polished wafer. In yet another example, the polished work piece may be subjected to any other process or condition that causes the work piece to have a neutral pH. In this regard, the decision to utilize either an acidic or a basic first cleaning composition may depend on factors other than the pH of the polishing slurry, such as, for example, cost of the cleaning compositions, availability of the cleaning compositions, preference of the CMP apparatus operator, and the like.

Turning back to FIG. 3, after the work piece is subjected to the first cleaning composition, the work piece is exposed to a second cleaning composition (320). In an exemplary embodiment of the method of the present invention, this step (320) further comprises determining whether to impart an acidic or basic cleaning composition to the neutralized work piece. Generally, if the first cleaning composition is an acidic cleaning composition, then at least a portion of the inorganic contaminants thereon has been cleaned off of the work piece and soluble organic contaminants may remain. Hence, the second cleaning composition may be a basic cleaning composition which may be used to remove at least a portion of the remaining organic contaminants. Alternatively, if the first cleaning composition is a basic cleaning composition, then at least a portion of the organic contaminants has been removed and the second cleaning composition may be an acidic cleaning composition that may be used to remove at least a portion of the inorganic contaminants.

Figure 4:
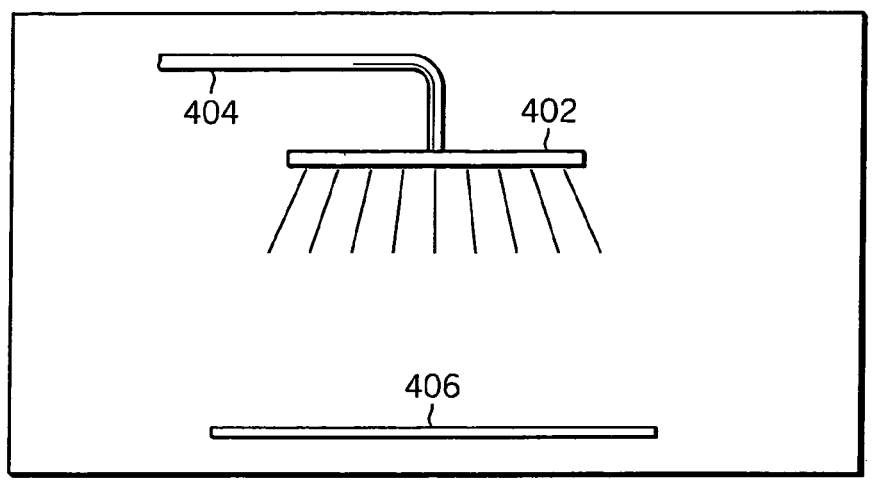
FIGS. 4–8 are schematic representations of various exemplary embodiments of a cleaning stations that may be employed in a CMP apparatus that may be used to carry out an exemplary embodiment of the method for cleaning a semiconductor work piece according to the present invention.

The first and second cleaning compositions may be applied to a work piece in any one of numerous fashions. As will be appreciated by those with skill in the art, the first and second cleaning compositions may be delivered to the work piece by the same method and/or by apparatuses or by different methods and/or apparatuses. In accordance with one exemplary embodiment of the invention, the cleaning compositions may be sprayed onto the work piece before or during cleaning of the work piece. Referring to FIG. 4, a spray apparatus 400 may be employed to spray cleaning composition onto a work piece. The spray apparatus 400 comprises a nozzle 402 that is coupled to a fluid supply channel 404 configured to deliver cleaning composition. The nozzle 402 is positioned proximate the work piece 406 so as to be capable of spraying, misting, or generally imparting the cleaning composition to at least a portion of the work piece 406.

Figure 5:
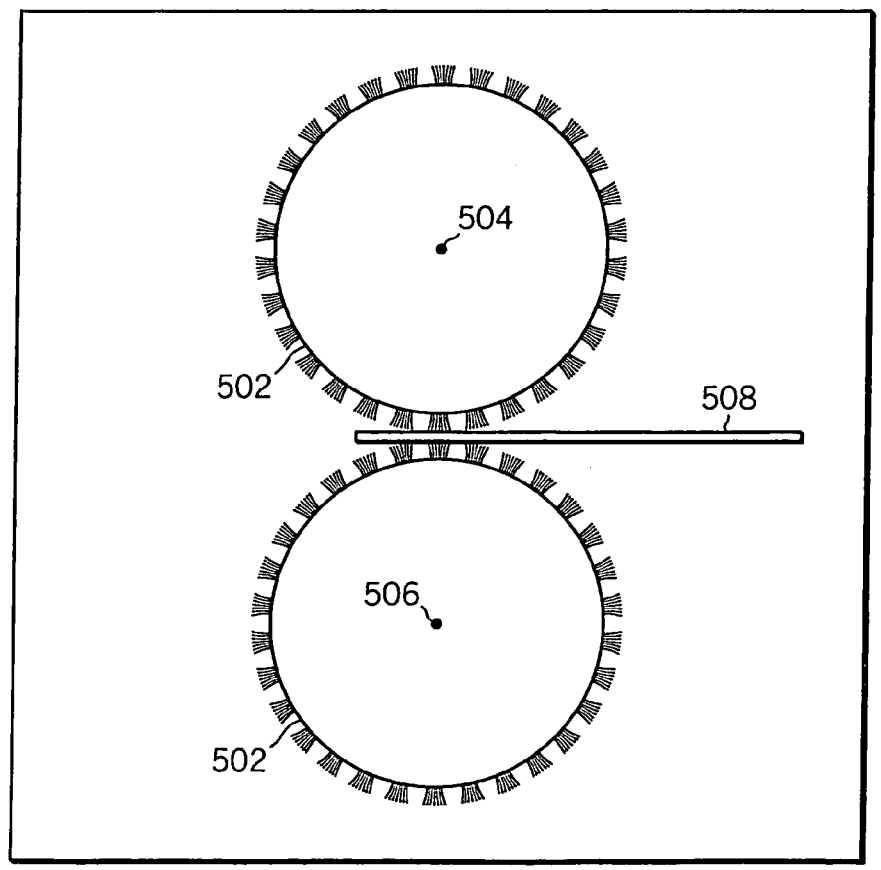
Figure 6:
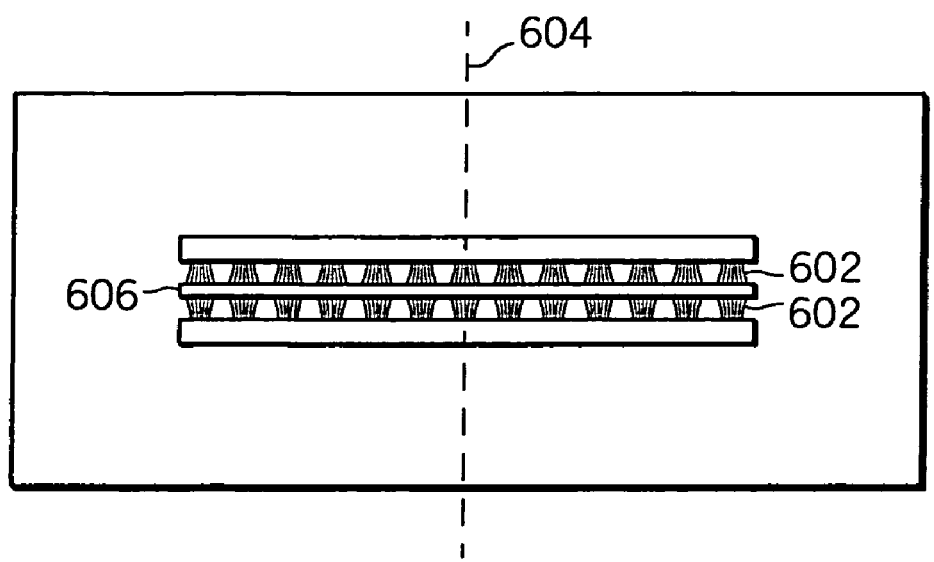

In another exemplary embodiment of the invention, after being sprayed with cleaning composition, the work piece may be urged against a brush using a low pressure force to further clean the work piece. Preferably, the pressure exerted by brushes is less than about 6 psi and most preferably less than about 0.25 psi. FIGS. 5 and 6 schematically illustrate two exemplary cleaning stations 500, 600 respectively, that may be configured to brush the work pieces. In the embodiment depicted in FIG. 5, the cleaning station 500 may include at least two roller brushes 502 that are each configured to rotate about parallel axes 504, 506 and provide low pressure brushing. A work piece 508 may be positioned between the roller brushes 502 so that at least one side of the work piece 608 may be cleaned.

Referring to FIG. 6, the cleaning station 600 includes at least two disc-shaped brushes 602 that are each configured to rotate about a vertical axis 604. The brushes 602 may be coupled to a fluid supply channel (not shown) and an aperture (not shown) may be configured to deliver cleaning composition to a work piece 606. The work piece 606 may be positioned between the two brushes 602 during the cleaning process. Other exemplary embodiments that comprise brushes are disclosed in U.S. Pat. Nos. 6,418,584, 6,461,441, 5,870,793, and 6,502,271 all assigned to Novellus, Inc. and incorporated herein by reference.

Figure 7:
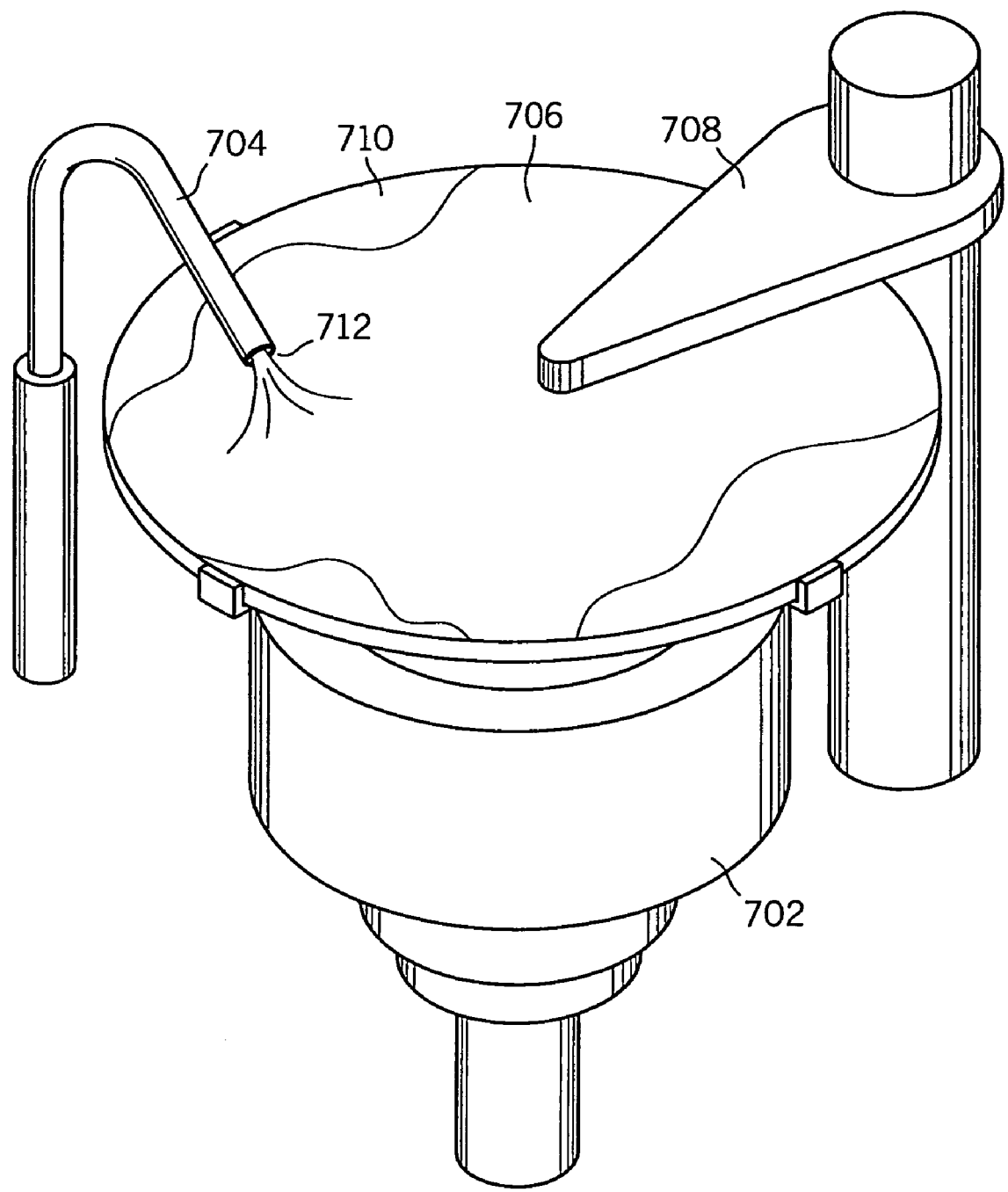

In another exemplary embodiment of the method of the present invention, sonic energy may be transmitted through the cleaning composition to facilitate cleaning of the work piece surface. Referring to FIG. 7, an exemplary embodiment of a cleaning station 700 includes a work piece carrier assembly 702, a fluid supply line 704, and a megasonic transducer 708. Generally, the work piece carrier assembly 702 is configured to support a work piece 710 during the cleaning process, and additionally may be configured to rotate the work piece 710. The fluid supply line 704 includes an aperture 712 that is configured to dispense cleaning composition 706 onto the work piece 710. The megasonic transducer 708 is disposed proximate the work piece 710 and is configured to cause sonic energy to travel through the cleaning composition 706 to loosen the contaminants on the work piece 710 thereby cleaning the work piece 710. In yet another exemplary embodiment, a moving fluid dispenser, examples of which are disclosed in U.S. Pat. Nos. 5,882,544 and 6,276,378 assigned to Tokyo Electron, Ltd., 6,568,408 and 6,398,975 assigned to IMEC, Ag, and 6,588,437 assigned to Agere, may be coupled to the fluid supply line 704 and used to dispense the cleaning composition onto the work piece 710.

Figure 8:
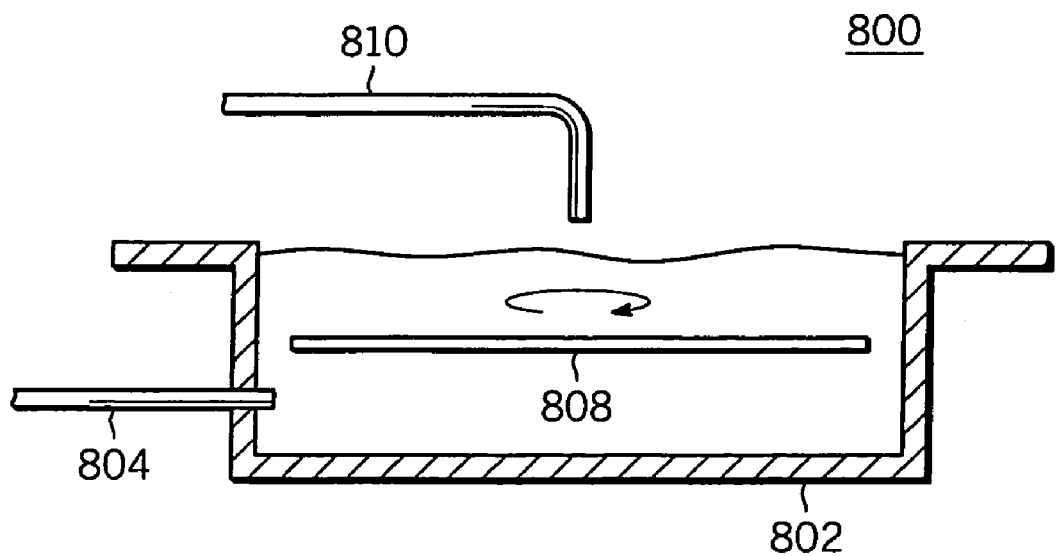

Referring to FIG. 8, in yet another exemplary embodiment of the method of the present invention, the work piece may be submerged in the cleaning composition. In this regard, a cleaning station 800 may comprise a tank 802 and a fluid supply channel 804. The fluid supply channel 804 may be configured to deliver the cleaning composition to the tank 802. When the tank 802 is sufficiently full of cleaning composition, the work piece 808 may be submerged into the cleaning composition for a time sufficient to permit adequate cleaning of the work piece by the cleaning composition. In another embodiment of the invention, while submerged, the work piece 808 may be rotated, oscillated, or otherwise moved to facilitate cleaning.

In yet another embodiment of the invention, sonic energy may be transmitted through the cleaning composition to further clean the work piece. The cleaning station 800 may further comprise a megasonic transducer configured to supply sonic energy to an applicator 810 that may be proximate the tank 802. When the work piece 808 is at least partially submerged in the first cleaning composition and the sonic energy is transmitted through the cleaning composition, the energy may aid in loosening at least a portion of the unwanted particles from the work piece 808 thereby cleaning the work piece 808.

In another exemplary embodiment of the method of the present invention, the work piece may be buffed with the first cleaning composition. In this regard, the buff station 116, schematically illustrated in FIG. 1, may include a nozzle (not shown) and a soft pad (not shown), such as a Politex pad from Rohm & Haas Equipment Manufacturers, Inc. Thus, after the work piece is polished in one of the polishing stations 108, 110, 112, and 114, robot 120 delivers the work piece to buff station 116, where the nozzle delivers the first cleaning composition the work piece and the soft pad buffs the work piece.

Referring back to FIG. 3, in another embodiment of the present invention, after the first cleaning composition is applied to the work piece (310), the work piece may be exposed to a first neutralizing agent (330). While not intending to be bound by theory, it is believed that after the work piece has been exposed to the first cleaning composition, the fluid that remains on the work piece after the first cleaning step (310) adopts the pH of the first cleaning composition. Thus, if the acidic-cleaned or basic-cleaned work piece is subsequently exposed to a second cleaning step using a basic cleaning composition or an acidic cleaning composition, respectively, the cleaning compositions may react with one another to yield typical acid-base reaction products, namely, a salt and water or a salt, gas, and water. These reaction products, which are generally considered contaminants, may be deposited onto the surface of the work piece. Accordingly, a neutralizing agent may be used to rinse the first cleaning composition from the workpiece thereby providing a neutralized environment on the work piece before it is exposed to the second cleaning composition.

The first neutralizing agent may be any one of numerous suitable compositions, preferably aqueous, that are capable of neutralizing either an acidic or basic cleaning composition. Some appropriate neutralizing agents include, but are not limited to, deionized water, aqueous non-ionic, cationic, anionic, and zwitterionic surfactants. According to an exemplary embodiment of the method of the present invention, the first neutralizing agent may have properties that allow it to cause the pH of the fluid remaining on the work piece after the first cleaning step (310) to be substantially within the range of 6–8. In a preferred embodiment of the invention, the first neutralizing agent has properties that cause the pH of the fluid remaining on the work piece after the first cleaning step (310) to be substantially equal to 7.

The first neutralizing agent may be imparted to the work piece in any one of numerous fashions. In accordance with one exemplary embodiment of the present invention, a cleaning station 124, 126 may be configured to deliver a neutralizing agent to the work piece via means that include, but are not limited to, a brush, a nozzle, an aperture, and/or a tank. According to another exemplary embodiment, the first neutralizing agent may also be delivered to the work from a component that is separate from either cleaning station 124, 126. In yet another exemplary embodiment of the present invention, the CMP apparatus 100 may include an additional tank or bath configured to contain the first neutralizing agent. As those with skill in the art may appreciate, numerous other configurations exist by which a neutralizing agent may be delivered.

In yet another exemplary embodiment of the present invention, after the work piece has been cleaned with the second cleaning composition, the work piece may be subjected to a second neutralizing agent (340). The second neutralizing agent may be utilized to rinse the second cleaning composition from the work piece. In one exemplary embodiment of the present invention, the second neutralizing agent may comprise the same neutralizing composition as the first neutralizing agent. In another exemplary embodiment, the second neutralizing agent may comprise a neutralizing composition different than the first neutralizing agent.

In yet another exemplary embodiment of the present invention, when brushes, such as brushes 500, 600 illustrated in FIGS. 5 and 6 are utilized, the brushes may be conditioned (shown in phantom as step (350, 360) after the first cleaning step (310), after the second cleaning step (320), or both (310, 320) with a brush conditioner. During cleaning (310, 320), the brushes may become contaminated with particles. These contaminants may accumulate in the brushes and may become re-deposited onto work pieces that are subsequently cleaned. Brush conditioning minimizes this undesired effect. In one exemplary embodiment of the present invention, a brush may be conditioned with the acidic or basic cleaning composition with which it cleans the work piece. In another exemplary embodiment of the present invention, the brushes may be conditioned with deionized water after each cleaning step (310, 320). In yet another exemplary embodiment of the invention, the brushes may be urged against a hard surface that is constructed of a hard material and is disposed proximate or within the cleaning station 124, 126. The brush may be pressed against the hard surface while being exposed to or, alternatively, after exposure to, the conditioner, so that the embedded particles may be loosened from the brush. One exemplary embodiment of the present invention that incorporates such a brush is described in U.S. Pat. No. 6,418,584, incorporated herein by reference.

To evidence the performance characteristics of various embodiments of the method for post-CMP cleaning according to the present invention, tests were conducted to compare the difference in the number of defects present on a work piece cleaned in accordance with an embodiment of the present invention and a work-piece cleaned in accordance with the prior art.

In a first test, sixteen (16) work pieces that each comprised a 200 mm electroplated Cu work piece were polished using a Momentum CMP apparatus from Novellus Systems, Inc. Each work piece was first subjected to Cu CMP using an abrasive-free C430 slurry and then subjected to a barrier CMP step using a T805 silica abrasive slurry (pH 2.8±0.1). An IC 1000 polishing pad available from Rodel, Inc. was used in the CMP apparatus.

A first batch of eight work pieces then was subjected to a cleaning method according to the present invention. Two brush units, each having an upper and lower brush, were used. First, an acidic cleaning composition was applied to each work piece for about thirty (30) seconds at a pressure of between about 0–0.25 psi. The upper brush was rotated at about 220 rpm, while the lower brush was rotated at about 150 rpm. Next, the workpieces were subjected to deionized water for about fifteen (15) seconds. Specifically, the deionized water was delivered to the workpieces through the upper and lower brush units at 0 psi pressure. Each workpiece was then cleaned with a basic cleaning composition for about thirty-five (35) seconds. The upper brush was rotated at about 220 rpm, while the lower brush was rotated at about 150 rpm, each at a pressure of about 0.25 psi. Then the workpieces were rinsed in deionized water for about ten (10) seconds at a pressure of about 0.25 psi. Lastly, the workpieces proceeded to a spin-rinse-dry unit for a final dry.

A second batch of eight work pieces was subjected to a conventional acid clean. Two brush units, each having an upper and lower brush, were used to apply the acidic cleaning composition to the workpieces for about 30 seconds at a pressure of about 0.25 psi. The upper brushes rotated at about 220 rpm, and the lower brushes rotated at about 150 rpm. Next, the work pieces were subjected to deionized water for about 15 seconds at a pressure of about 0.25 psi. Then, the workpieces were subjected to spin-rinse-dry.

Figure 9:
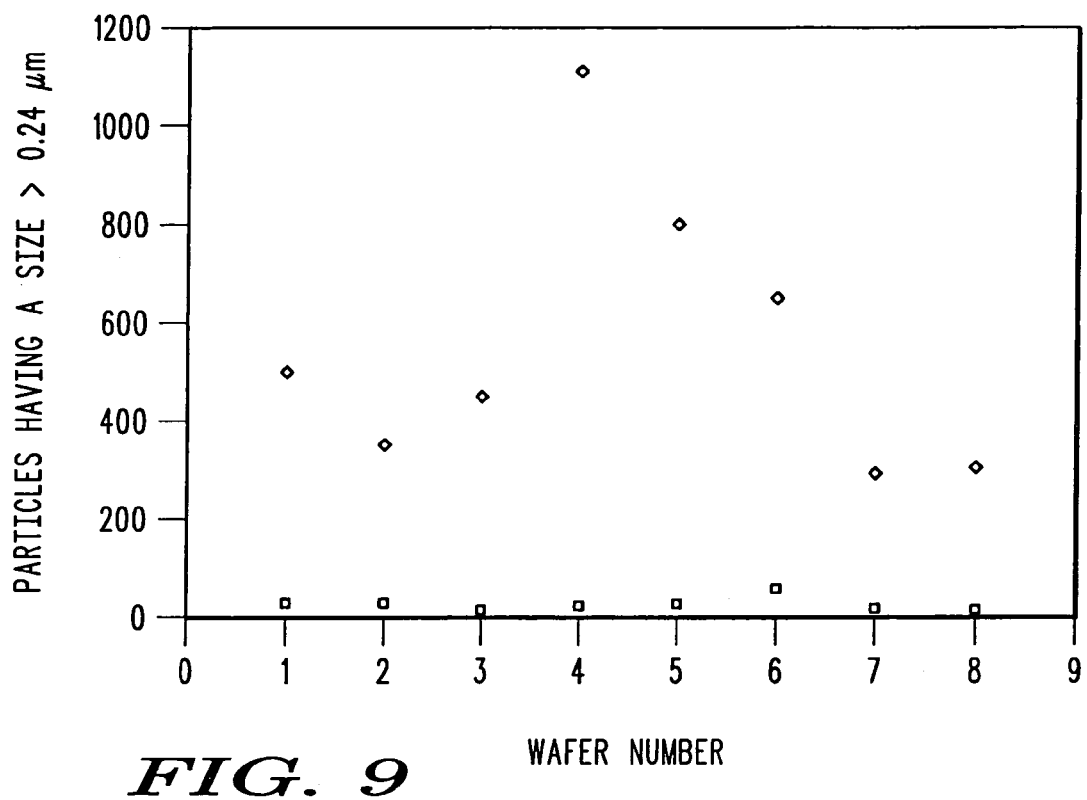
FIG. 9 is a graph comparing the number of particles counted on work pieces having Cu deposited thereon that have been subjected to cleaning in accordance with an exemplary embodiment of the method of the present invention and work pieces having Cu deposited thereon that have been subjected to cleaning in accordance with a cleaning method used in prior art.

FIG. 9 provides a graph comparing the number of particles greater than 0.24 microns found on the first and second batches of Cu work pieces. Each work piece of the first batch of work pieces is represented in the graph a square, while each work piece of the second batch of work pieces is represented as a diamond. As evident from FIG. 9, the first batch of work pieces comprised substantially fewer particles after processing than the second batch of work pieces.

In a second test, sixteen (16) work pieces each comprising a 200 mm work piece having a layer of $SiO_2$ deposited thereon ("TEOS work pieces") was polished with a Momentum CMP apparatus from Novellus Systems, Inc. Each work piece was first subjected to CMP using an abrasive-free C430 slurry and then subjected to a barrier CMP step using a T805 silica abrasive slurry (pH 2.8±0.1). An IC 1000 polishing pad available from Rodel, Inc. was used in the CMP apparatus.

Figure 10:
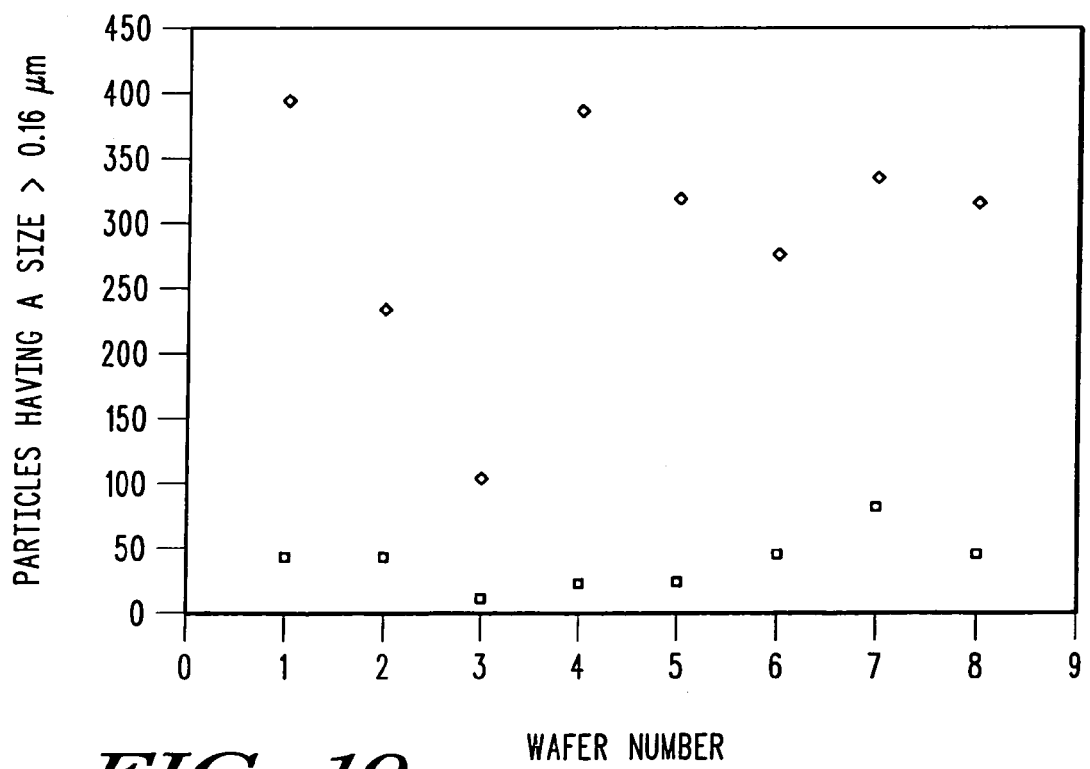
FIG. 10 is a graph comparing the number of particles counted on work pieces having an $SiO_2$ layer deposited thereon that have been subjected to cleaning in accordance with an exemplary embodiment of the method of the present invention and work pieces having an $SiO_2$ layer deposited thereon that have been subjected to cleaning in accordance with a cleaning method used in prior art.

A first batch of eight of the TEOS work pieces then was subjected to the acid and base cleaning process described above with reference to FIG. 9. A second batch of the remaining eight TEOS work pieces was subjected to the same conventional acid clean described above. FIG. 10 shows a graph comparing the number of particles having a particle size of greater than 0.16 microns that were found on the first and second batches of TEOS work pieces. Each work piece of the first batch of work pieces is represented in the graph a square, while each work piece of the second batch of work pieces is represented as a diamond. As is evident from FIG. 10, the first batch of work pieces comprised substantially fewer particles than the second batch of work pieces.

Thus, there has been provided a method and apparatus for post-CMP cleaning of work pieces having thin films that helps to improve the quality of resulting semiconductor work pieces. The method generally comprises subjecting a work piece to CMP; exposing the polished work piece to a first cleaning composition to remove at least a portion of the contaminants that appear on the surface of the work piece and subjecting the work piece to a second cleaning composition to remove at least a portion of the contaminants that were not cleaned from the work piece surface after exposure to the first cleaning composition.

In the foregoing specification, the invention has been described with reference to specific embodiments. However it may be appreciated that various modifications and changes can be made without departing from the scope of the invention as set forth in the appended claims. Accordingly, the specification and figures are to be regarded as illustrative rather than as restrictive, and all such modifications are intended to be included within the scope of the present invention.

The invention claimed is:

1. An apparatus for cleaning a work piece including copper thereon, comprising:
   a first work piece cleaning station;
   a first cleaning composition in fluid communication with the first work piece cleaning station, the first cleaning composition comprising a corrosion inhibitor and having one of an acidic or a basic pH;
   a second work piece cleaning station disposed proximate the first work piece cleaning station;
   a second cleaning composition in fluid communication with the second work piece cleaning station, the second cleaning composition comprising a corrosion inhibitor and having an acidic pH, if the first cleaning composition has a basic pH, or having a basic pH, if the first cleaning composition has an acidic pH; and
   a robot configured to transfer the work piece between the first and second work piece cleaning stations.

2. The apparatus of claim 1, wherein the first work piece cleaning station comprises one of a brush station, a buff station, a dip tank, a megasonic transducer configured to transmit sonic energy through the first cleaning composition, and a nozzle configured to spray the first cleaning composition at the work piece.

3. The apparatus of claim 1, wherein the second work piece cleaning station comprises one of a brush station, a buff station, a dip tank, a megasonic transducer configured to transmit sonic energy through the second cleaning composition, and a nozzle configured to spray the second cleaning composition at the work piece.

4. The apparatus of claim 1, further comprising a dispenser configured to contain a neutralizing composition.

5. The apparatus of claim 4, wherein at least one of the first and second work piece cleaning stations communicates with the dispenser and the dispenser is configured to dispense the neutralizing composition at at least one of the first and second work piece cleaning stations.

6. The apparatus of claim 1, wherein at least one of the first and second work piece cleaning stations further comprises a work piece carrier assembly that is configured to rotate the work piece when the workpiece is disposed therein.

7. The apparatus of claim 1, further comprising a polishing station configured to chemically mechanically polish the work piece.

8. The apparatus of claim 7, wherein the robot is configured to transfer the work piece between the first and second work piece cleaning stations and the polishing station.

9. An apparatus for cleaning a work piece including copper thereon, comprising:
   a work piece cleaning station;
   a first cleaning composition in fluid communication with the work piece cleaning station, the first cleaning composition comprising a corrosion inhibitor and having one of an acidic pH and a basic pH;
   a second cleaning composition in fluid communication with the work piece cleaning station, the second cleaning composition comprising a corrosion inhibitor and having an acidic pH, if the first cleaning composition has a basic pH, or having a basic pH, if the first cleaning composition has an acidic pH; and a polishing station proximate the work piece cleaning station configured to chemically mechanically polish the work piece.

10. The apparatus of claim 9, wherein the work piece cleaning station comprises one of a buff station, a brush station, a dip tank, a megasonic transducer configured to transmit sonic energy through the first and second cleaning compositions, and a nozzle configured to spray the first and second cleaning compositions at the work piece.

11. The apparatus of claim 9, further comprising a dispenser configured to contain a neutralizing composition.

12. The apparatus of claim 11, wherein the cleaning station communicates with the dispenser and the dispenser is configured to dispense the neutralizing composition.

13. The apparatus of claim 9, wherein the cleaning station further comprises a work piece carrier assembly that is configured to rotate the work piece when the work piece is disposed therein.

14. An apparatus for cleaning a work piece including copper thereon, comprising:
  a polishing station configured to chemically mechanically polish the work piece;
  a first work piece cleaning station disposed proximate the polishing station;
  a first cleaning composition in fluid communication with the first work piece cleaning station, the first cleaning composition comprising a corrosion inhibitor and having one of an acidic pH and a basic pH;
  a second cleaning composition in fluid communication with the first work piece cleaning station, the second cleaning composition comprising a corrosion inhibitor and having an acidic pH, if the first cleaning composition has a basic pH, or having a basic pH, if the first cleaning composition has an acidic pH; and
  a first robot configured to transfer the work piece between the first work piece cleaning station and the polishing station.

15. The apparatus of claim 14, wherein the first cleaning station comprises one of a brush station, a buff station, a dip tank, a megasonic transducer configured to transmit sonic energy through the first and the second cleaning compositions, and a nozzle configured to spray the first and second cleaning compositions at the work piece.

16. The apparatus of claim 14, further comprising a dispenser configured to contain a neutralizing composition.

17. The apparatus of claim 16, wherein the first work piece cleaning station communicates with the dispenser and the dispenser is configured to dispense the neutralizing composition therein.

18. The apparatus of claim 14, wherein the first work piece cleaning station further comprises a work piece carrier assembly that is configured to rotate the work piece when the work piece is disposed therein.

19. The apparatus of claim 14, further comprising a second work piece cleaning station in fluid communication with the first and the second cleaning compositions, the second work piece cleaning station comprising one of a brush station, a buff station, a dip tank, a megasonic transducer configured to transmit sonic energy through the first and the second cleaning composition, and a nozzle configured to spray the first and the second cleaning composition at the work piece.

20. The apparatus of claim 19, further comprising a second robot configured to transfer the work piece between the first and second cleaning stations.

* * * * *